United States Patent [19]
Joly

[11] 4,259,726

[45] Mar. 31, 1981

[54] DIODE ARRAY CONVOLVER

[75] Inventor: Robert Joly, Palo Alto, Calif.

[73] Assignee: The United States of America as represented by the Secretary of the Navy, Washington, D.C.

[21] Appl. No.: 957,763

[22] Filed: Nov. 3, 1978

[51] Int. Cl.[3] .................... G06G 7/195; H01L 41/08

[52] U.S. Cl. .............................. 364/821; 310/313 R; 333/154; 364/861

[58] Field of Search .................. 364/821, 861; 357/26; 333/150, 151, 154; 310/313

[56] References Cited

U.S. PATENT DOCUMENTS

| | | | |
|---|---|---|---|
| 3,833,867 | 9/1974 | Solie | 364/821 X |
| 3,925,653 | 12/1975 | Otto | 364/821 |
| 4,016,513 | 4/1977 | Solie | 364/821 X |
| 4,028,565 | 6/1977 | Davis | 357/26 X |
| 4,055,758 | 10/1977 | Stern et al. | 364/821 |
| 4,070,625 | 1/1978 | Heng et al. | 364/821 X |
| 4,101,965 | 7/1978 | Ingebrigtsen et al. | 364/821 |
| 4,124,828 | 11/1978 | Bert | 364/821 X |

OTHER PUBLICATIONS

Wang et al., Surface Wave Convolver via Space Charge Non-linearity, 1972 Ultrasonic Symposium Proceedings (Bosten, MA), pp. 316-321.

*Primary Examiner*—Felix D. Gruber

*Attorney, Agent, or Firm*—R. S. Sciascia; Charles D. B. Curry; George L. Craig

[57] ABSTRACT

A diode array convolver using narrow rails on a transparent piezoelectric substrate to support a MESA diode array.

5 Claims, 4 Drawing Figures

DIODE ARRAY CONVOLVER

BACKGROUND OF THE INVENTION

1. Field of the Invention

The invention relates to the art of signal convolver devices for generating a convolved output signal from a pair of predetermined input signals. More particularly, the invention pertains to improving the light sensitivity of the signal convolving device by using the photovoltaic effect of a diode array such that the signal convolver can be used as an imaging device.

2. Description of Prior Art

Many devices of prior art exist which perform the convolution of two acoustic wave input signals introduced at opposite ends of an acoustic wave propagation medium having piezoelectric properties. The oppositely propagating acoustic waves $W_1$, $W_2$ generated by the application of two signals to the piezoelectric medium are arranged to provide a second-order parametric interaction at an output electrode near the central region of the medium where the waves overlap. The physical realization of convolution $C_n$ of the two time functions $f(\tau)$, $g(\tau)$ generated is mathematically represented by $$C_n = \int f(\tau) g(t-\tau)\, d\tau$$

where t is representative of the time displacement between the two functions. The applied signals are at such a power level that nonlinear effects result in the wave propagation medium. In particular, a component of electric displacement proportional to the product of the amplitudes of the two modulated acoustic waves in the medium is generated at the point of wave overlap and represents the convolution of the two signals. An output signal will only be observed when the conditions of nonlinear parametric interaction exist, e.g., phase matching and frequency conservation, and thus good signal discrimination is obtained with such a device.

Prior art use of such signal convolvers has concentrated on acoustic convolution only using slablike semiconductor layers either contacting or slightly separated from the wave propagation medium in the interaction region so that the electric displacement field is coupled into the body of the semiconductor material. Furthermore, prior art devices generally use opaque wave propagation mediums permitting only acoustic convolution. However, further modulation of the signal tapped from the semiconductor is possible if the wave propagation medium is made transparent and if a diode array is substituted for the semiconductor slab normally used. A light may then be shined through the transparent wave propagation medium coincident with generation of the acoustic waves $W_1$, $W_2$. The photovoltaic effect of the diode array permits modulation of the convolved signal by modulation of light intensity of the light source beamed upon the transparent wave propagation medium, and thus the convolver may be used as an imaging device.

SUMMARY OF THE INVENTION

The invention is briefly described as a signal convolver having a photosensitive diode array mounted upon a transparent wave propagation medium. Thus a light modulated convolved output signal may be obtained from a pair of predetermined input signals oppositely introduced into the wave propagation medium. A primary object of invention is to provide a signal convolver that may be used as an imaging device. A second object of invention is to provide a light sensitive diode array having a mesa structure mounted on narrow supporting rails on an acoustic wave propagation medium such that the output from the diode array is a light modulated convolution of two input signals oppositely introduced into the wave propagation medium.

DESCRIPTION OF THE PREFERRED EMBODIMENT

Figure 1:
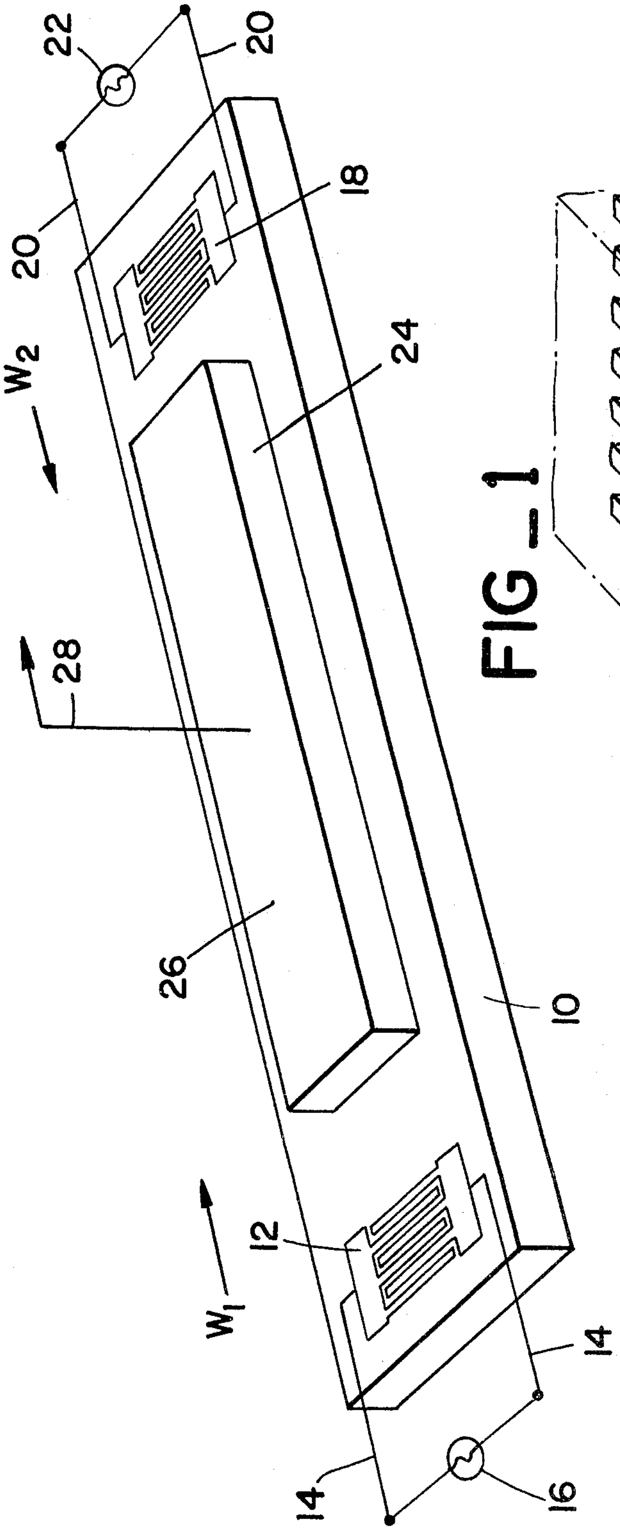
FIG. 1 shows a perspective view of the signal convolver.

Referring to FIG. 1, there is shown a perspective view of the imaging signal convolving device. The device is formed on a transparent piezoelectric substrate 10 such as $L_iNbO_3$ capable of supporting the propagation of acoustic waves. Formed at each end on the surface of the substrate 10 are interdigital transducers 12, 18 formed of some conductive material such as gold, aluminum or the like. Transducer 12 is coupled by lines 14 to an external signal source 16. Similarly, transducer 18 is coupled by lines 20 to another external signal source 22. The transducers 12, 18 and their external connections, 14, 16 and 20, 22 respectively, comprise the means for launching acoustic waves $W_1$ and $W_2$ into the substrate 10. The two waves $W_1$, $W_2$ are only launched in opposition to one another.

On the substrate 10 and located between the transducers 12, 18 is a thin mesa structure diode array 24 and upon the diode array is deposited a thin layer 26 of conducting material such as gold or the like to which an output signal lead 28 is attached.

Figure 2:
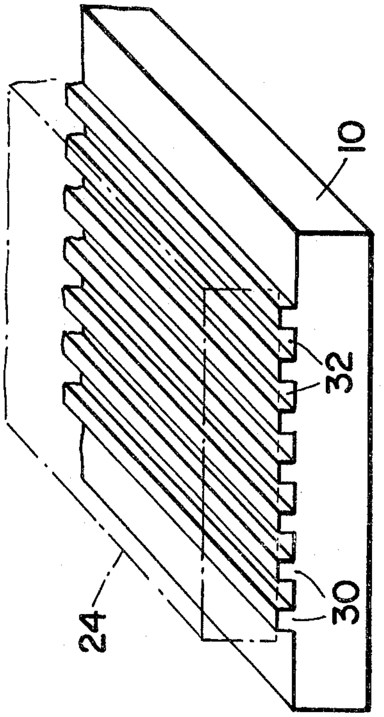
FIG. 2 shows an end view of the narrow rail support structure.

Referring to FIG. 2, an end view is shown of the support interface between the wave propagation medium 10 and the mesa structure diode array 24. The support interface is comprised of thin narrow support rails 30 alternating with small air gaps 32 between rails. The rail 30 and air gap 32 interface extends the length of the diode array 24. The air gap 32 exists to avoid mass loading between the wave propagation medium 10 and the diode array. The support rails 30 are obtained by sputter etching techniques familiar to those in the art. The photolithographic mask generally used for such etching is easy to make for such a rail structure and needs no pattern generator usually required for weaker, more complex support structures used in prior art devices. Further no longitudinal periodicity of the generated signals exists with such a structure and thus coherent reflection problems inherent in other conventional structures causing signal attenuation are avoided.

Figures 3A, 3B:
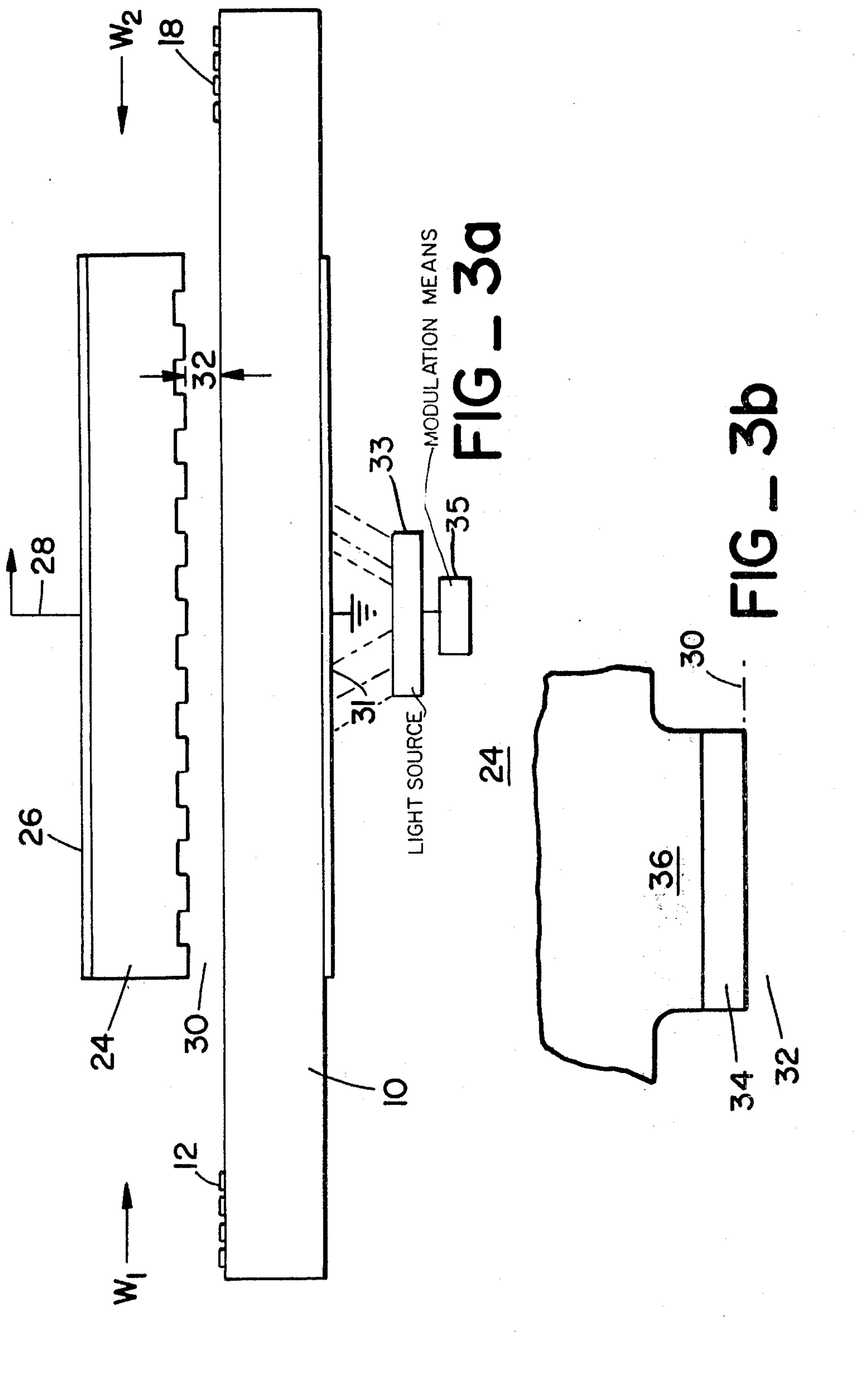
FIG. 3*a* shows a side view of the signal convolver.
FIG. 3*b* shows an enlarged view of the mesa diode structure.

Referring to FIG. 3*a*, a side view of the imaging signal convolving device is shown along with the light source 33 and light source modulation means 35 as described in the prior art. The typical mesa diode structure 24 is shown where the upper portion is some semiconductor substrate such as silicon. Regions of $p^+(n^+)$ are diffused into the n (p) type substrate and then the substrate is etched away from the diffused areas leaving plateau regions juxtaposed to the rail support structure 30 forming individual collectors for the diodes in the array. FIG. 3*b* shows a greatly expanded sectional view of such a composite structure, the collector 34 sitting between the rail 30 or airgap 32 and the substrate region forming the base of the diode 36. A ground plane 31 is attached to the bottom of the delay line 10. The mesa diode array 24 is used to avoid the surface effects such as those due to fast and slow surface states by working in the bulk of the semi-conductor that is in the depletion region of the diodes.

The mesa array 24 provides good isolation between the diodes thus improving the resolution of the convolver used in conjunction with the modulated light beam as an imaging device. In conventional signal convolvers using simple silicon slabs instead of a diode array, the lateral diffusion of excess carriers within the bulk of the semiconductor generated by a spot of light severely limits the resolution of the device. In the instant invention, the resolution limit is defined by the diode and associated light beam modulating signal. With current art in diode manufacture, the resolution of the convolver may actually be limited by the acoustic input signal frequency. The mesa diode structure 24 may use a variety of semiconductor materials such as silicon or gallium arsenide for example and the diodes may be of the $p^+n$ or $n^+p$ type.

Therefore, by the teachings of the instant invention, a new and unique imaging signal convolver is obtained. Further, the use of narrow support rails in the manufacture of the device permits greatly reduced complexity of construction as well as providing greatly reduced waveform distortion of the input acoustic waves.

What is claimed is:

1. A signal convolving device comprising:

(a) a body adapted for propagating acoustic waves and having a first end, a second end, an upper surface and a lower surface;

(b) first means for propagating a first acoustic wave adjacent said first end of said body toward said second end;

(c) second means for propagating a second acoustic wave adjacent said second end of said body toward said first end;

(d) means for convolving the electric field signal occurring from the interaction of said first acoustic wave and said second acoustic wave in said body, said convolving means having sensitivity to light and extending substantially between said first propagating means and said second propagating means, said convolving means outputting a signal;

(e) an alternating narrow rail structure extending the length of said body, said narrow rail structure interposed between said body and said convolving means, said narrow rail structure supporting said convolving means and providing an air gap between said body and said convolving means;

(f) means for conducting said signal from said convolving means; and (g) light source for modulating said output signal of said convolving means, said light source being disposed below said lower surface of said body and directing radiant energy through said body and into said convolving means.

2. A signal convolving device as recited in claim 1 wherein said body adapted for propagating acoustic waves is composed of a light transparent block of lithium niobate.

3. A signal convolving device as recited in claim 1 wherein said convolving means is a mesa structure diode array.

4. A signal convolving device as recited in claim 3 wherein said diode array is a $p^+n$ configuration.

5. A signal convolving device as recited in claim 3 wherein said diode array is an $n^+p$ configuration.

* * * * *